US011758665B2

(12) United States Patent
Lin et al.

(10) Patent No.: US 11,758,665 B2
(45) Date of Patent: Sep. 12, 2023

(54) BATTERY CONNECTION MODULE AND BATTERY DEVICE

(71) Applicant: Molex, LLC, Lisle, IL (US)

(72) Inventors: Yong Lin, ChengDu (CN); Shang Xiu Zeng, ChengDu (CN); Kian Heng Lim, Jurong Town (SG)

(73) Assignee: Molex, LLC, Lisle, IL (US)

( * ) Notice: Subject to any disclaimer, the term of this patent is extended or adjusted under 35 U.S.C. 154(b) by 457 days.

(21) Appl. No.: 16/871,045

(22) Filed: May 11, 2020

(65) Prior Publication Data

US 2020/0365866 A1    Nov. 19, 2020

(30) Foreign Application Priority Data

May 17, 2019 (CN) .......................... 201910414588.8

(51) Int. Cl.
*H05K 1/18* (2006.01)
*H05K 1/02* (2006.01)
(Continued)

(52) U.S. Cl.
CPC .......... *H05K 1/189* (2013.01); *H01M 50/507* (2021.01); *H01M 50/51* (2021.01);
(Continued)

(58) Field of Classification Search
CPC ........ H05K 1/028; H05K 1/189; H05K 1/118; H05K 1/148; H05K 2201/09063;
(Continued)

(56) References Cited

U.S. PATENT DOCUMENTS

2010/0155109 A1* 6/2010 Takahashi .............. H05K 1/028
174/254
2010/0203363 A1 8/2010 Koh et al.
(Continued)

FOREIGN PATENT DOCUMENTS

CN 205583026 U 9/2016
CN 206211098 U 5/2017
(Continued)

OTHER PUBLICATIONS

Englsh Machine Translation of Yang (CN 206211098) (Year: 2017).*
(Continued)

*Primary Examiner* — Roshn K Varghese

(57) ABSTRACT

The present disclosure relates to a battery connection module and a battery device. The battery connection module includes a carrying tray, a plurality of busbars and a flexible circuit board. The plurality of busbars are provided to the carrying tray. The flexible circuit board is provided to the carrying tray and includes a main board body and a plurality of connecting board bodies integrally connected to the main board body in a floatable manner and respectively electrically connected to the plurality of busbars, each connecting board body is provided to a side edge of the main board body, extends in a longitudinal direction and faces the corresponding busbar in a transverse direction, each connecting board body has a central portion and two cantilevered portions respectively extending from two opposite sides of the central portion in the longitudinal direction, each cantilevered portion has a proximal segment connected to the central portion, a distal segment opposite to the proximal segment and a curved segment positioned between the proximal segment and the distal segment, the curved segment extends along at least the longitudinal direction and the transverse direction, each connecting board body is connected to the main board body only by the distal segments of the two cantilevered portions, a gap is formed between the connecting board body and the main board body.

19 Claims, 11 Drawing Sheets

(51) Int. Cl.
  *H01M 50/51*     (2021.01)
  *H01M 50/519*    (2021.01)
  *H01M 50/507*    (2021.01)

(52) U.S. Cl.
  CPC .......... *H01M 50/519* (2021.01); *H05K 1/028* (2013.01); *H05K 2201/09063* (2013.01); *H05K 2201/10151* (2013.01); *H05K 2201/10189* (2013.01); *H05K 2201/10272* (2013.01)

(58) Field of Classification Search
  CPC .......... H05K 2201/10151; H05K 2201/10189; H05K 2201/10272; H05K 2201/09263; H05K 2201/10037; H01M 50/502; H01M 50/507; H01M 50/519; H01M 50/204; H01M 50/503; H01M 50/512; Y02E 60/10
  See application file for complete search history.

(56) References Cited

U.S. PATENT DOCUMENTS

| | | |
|---|---|---|
| 2015/0008027 A1 | 1/2015 | Finn |
| 2015/0072175 A1 | 3/2015 | DeKeuster et al. |
| 2016/0172649 A1 | 6/2016 | Morgan et al. |
| 2016/0336575 A1 | 11/2016 | Liu |

FOREIGN PATENT DOCUMENTS

| | | |
|---|---|---|
| CN | 206878083 U | 1/2018 |
| CN | 108158506 A | 6/2018 |
| CN | 207474565 U | 6/2018 |
| CN | 109524609 A | 3/2019 |
| FR | 3044474 A1 | 6/2017 |
| JP | 2014130779 A | 7/2014 |
| TW | I612713 B | 1/2018 |
| TW | 201909487 A | 3/2019 |
| TW | 201916431 A | 4/2019 |

OTHER PUBLICATIONS

Englsh Machine Translation of Liu (CN 207474565) (Year: 2018).*
Englsh Machine Translation of You (CN 206878083) (Year: 2018).*
Office Action received for JP Application No. 2020-082965, dated Jun. 29, 2021, 08 Pages (04 Pages of English Translation and 04 Pages of Official notification).
Office Action received for CN Application No. 201910414588.8, dated Apr. 19, 2022, 19 Pages (08 Pages of English translation and 11 Pages of Official notification).
Notice of Allowance received for CN Application No. 201910414588.8 dated Nov. 1, 2022, 09 Pages (04 Pages of English translation and 05 Pages of Official notification).

* cited by examiner

BATTERY CONNECTION MODULE AND BATTERY DEVICE

RELATED APPLICATION

This application claims priority to Chinese Application Serial No. 201910414588.8, filed on May 17, 2019, which is incorporated by reference in its entirety.

TECHNICAL FIELD

The present disclosure relates to a battery connection module, and particularly to a battery connection module and a battery device for connecting batteries.

BACKGROUND

A battery device, in which a battery set is generally formed by a plurality of electrochemically rechargeable batteries arranged side by side, such as a battery device for vehicle, usually uses a battery connection module to connect the batteries in series to form a pair of output electrodes, and is provided with a battery management system (abbreviated as BMS) made of a flexible circuit board as a main body to monitor values of the batteries such as voltages, temperatures and the like. Chinese Patent application issuance publication No. CN206211098U discloses a connection assembly for a battery set. The connection assembly includes mating connecting pieces electrically connected with the battery set and a connecting member provided to the mating connecting pieces. The connecting member may be made of a flexible circuit board, and includes a connecting body and a plurality of deforming portions. The plurality of deforming portions are provided by extending transversely and inwardly from an outer side edge of the connecting body, and each have a tail end and a head end, and a transverse gap is provided between the tail end and the connecting body, so that the deforming portion has a deformation space along a transverse direction of the connecting body. The plurality of deforming portions are used to be electrically and mechanically connected with the mating connecting pieces, enhance anti-vibration ability through the deformation space, and maintain connection stability in a running process of a vehicle. However, the existing connecting member and the different mating connecting pieces may still have poor connection effects due to design tolerances or artificial assembling deviations, thus deformability of the existing connecting member still needs to be improved.

SUMMARY

Therefore, an object of the present disclosure is to provide a battery connection module and a battery device with a higher deformability and a better anti-vibration effect.

Accordingly, in some embodiments, a battery connection module of the present disclosure comprises a carrying tray, a plurality of busbars and a flexible circuit board. The plurality of busbars are provided to the carrying tray. The flexible circuit board is provided to the carrying tray and comprises a main board body and a plurality of connecting board bodies integrally connected to the main board body in a floatable manner and respectively electrically connected to the plurality of busbars, each connecting board body is provided to a side edge of the main board body, extends in a longitudinal direction and faces the corresponding busbar in a transverse direction, each connecting board body has a central portion and two cantilevered portions respectively extending at two opposite sides of the central portion in the longitudinal direction, each cantilevered portion has a proximal segment connected to the central portion, a distal segment opposite to the proximal segment and a curved segment positioned between the proximal segment and the distal segment, the curved segment extends along at least the longitudinal direction and the transverse direction, each connecting board body is connected to the main board body only by the distal segments of the two cantilevered portions, a gap is formed between the connecting board body and the main board body.

In some embodiments, the plurality of connecting board bodies are provided to a periphery of the main board body toward the plurality of busbars.

In some embodiments, the gap is divided into a first gap which is positioned between the central portion and the main board body and two second gaps which are respectively positioned between the two cantilevered portions and the main board body and communicated with the first gap.

In some embodiments, the first gap has a longitudinal portion and two transverse portions perpendicularly connected to both ends of the longitudinal portion respectively In some embodiments, the proximal segment of each cantilevered portion is connected to the central portion in the longitudinal direction, the distal segment of each cantilevered portion is connected to the main board body in the longitudinal direction.

In some embodiments, each curved segment is U-shaped and opens outwardly.

In some embodiments, an enlarged hole is formed to a tail end of each second gap.

In some embodiments, the proximal segment of each cantilevered portion is connected to the central portion in the longitudinal direction, the distal segment of each cantilevered portion is connected to the main board body in the transverse direction.

In some embodiments, each curved segment is L-shaped, each cantilevered portion further has a longitudinal segment connecting the proximal segment and the curved segment, and a transverse segment connecting the curved segment and the distal segment, a third gap is further formed between the transverse segment and the main board body, the third gap and the second gap are positioned at both sides of the transverse segment.

In some embodiments, a tail end of each second gap and a tail end of each third gap each are formed with an enlarged hole.

In some embodiments, the plurality of connecting board bodies protrude outwardly relative to the periphery of the main board body, the first gap extends in the longitudinal direction along a profile of a side of the central portion, each second gap bends and extends along a profile of a side of the cantilevered portion.

In some embodiments, the proximal segment of each cantilevered portion is connected to the central portion in the longitudinal direction, the distal segment of each cantilevered portion is connected to the main board body in the transverse direction.

In some embodiments, each curved segment is U-shaped and protrudes outwardly.

In some embodiments, the flexible circuit board further has a plurality of side board bodies integrally connected to the periphery of the main board body, each connecting board body is positioned between the main board body and the corresponding side board body.

In some embodiments, each curved segment is U-shaped and opens outwardly.

In some embodiments, an enlarged hole is formed to a tail end of each second gap.

Accordingly, in some embodiments, a battery device of the present disclosure comprises a battery set, the aforementioned battery connection module and a plurality of conductive bridging pieces. The plurality of busbars of the battery connection module are electrically and mechanically connected to the battery set. The plurality of conductive bridging pieces are respectively connected between the plurality of central portions of the flexible circuit board and the plurality of busbars of the battery connection module.

The present disclosure at least has the following beneficial effects: the cantilevered portion of the connecting board body of the flexible circuit board is designed to extend along at least two directions, so that the connecting board body has a better deformability to overcome a tolerance between the connecting board body and the corresponding busbar, and in turn more stable electrical connection effect and anti-vibration effect can be achieved.

BRIEF DESCRIPTION OF THE DRAWINGS

The other features and effects of the present disclosure will be apparent in the detailed description in combination with the accompanying figures, and in which.

DETAILED DESCRIPTION OF PREFERRED EMBODIMENTS

Figure 1:
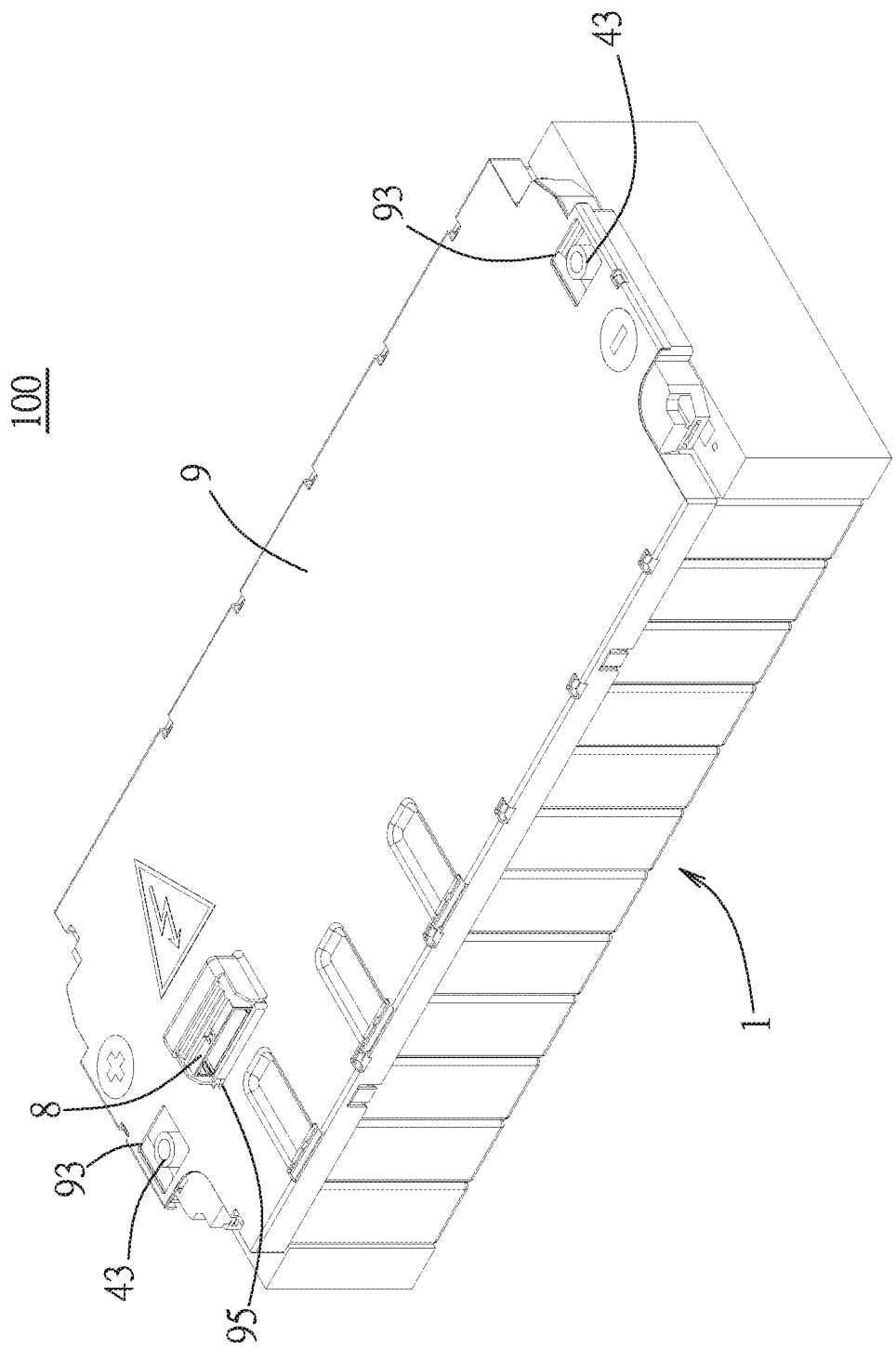
FIG. 1 is a perspective view of a first embodiment of a battery device of the present disclosure.

Before the present disclosure is described in detail, it should be noted that similar element is indicated by the same reference numeral in the following description.

Figure 2:
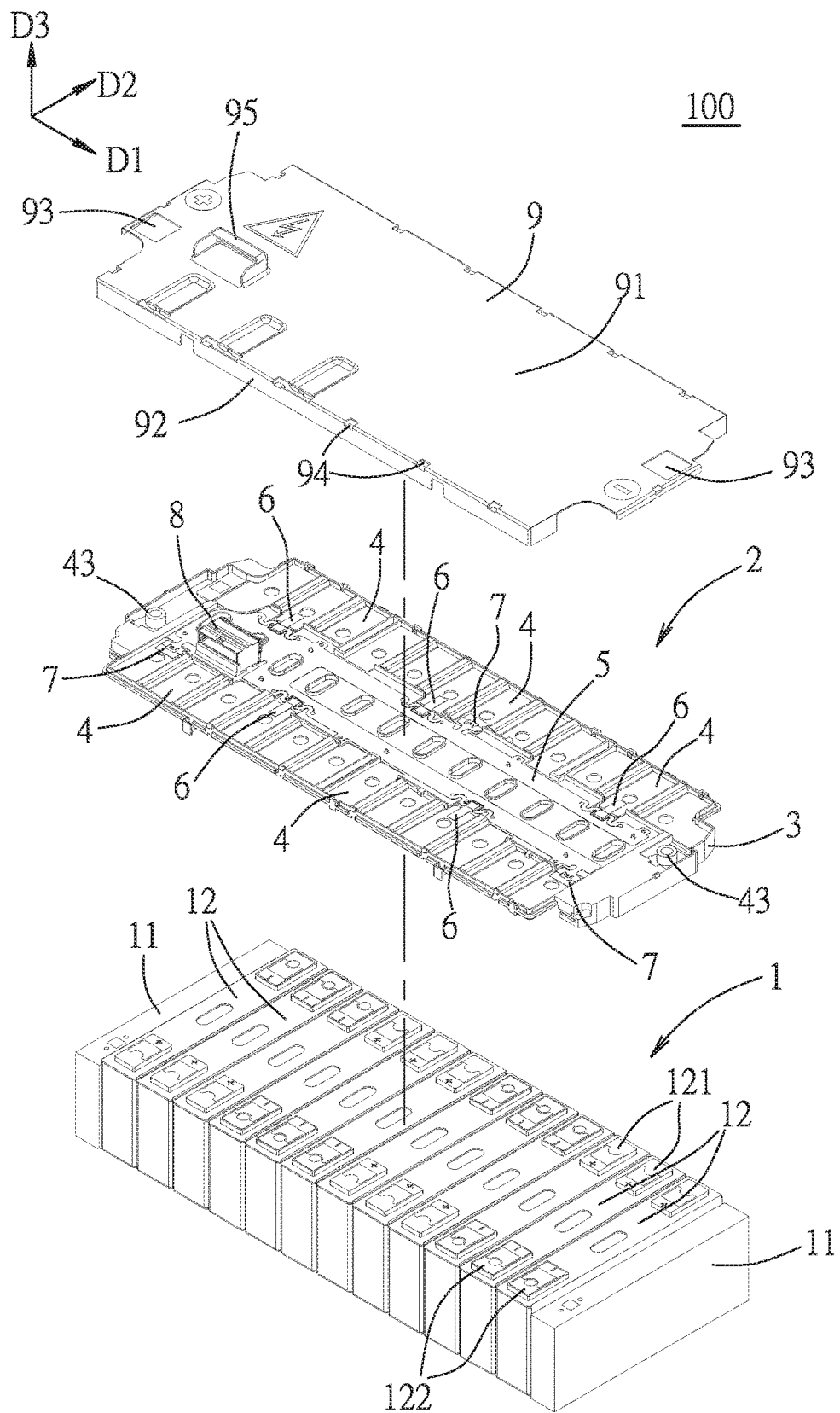
FIG. 2 is an exploded perspective view of the first embodiment.

Referring to FIG. 1 and FIG. 2, a first embodiment of a battery device 100 of the present disclosure includes a battery set 1, a battery connection module 2 and an upper cover 9.

The battery set 1 is adapted to be accommodated in a battery box (not shown in figures), and includes two end plates 11 spaced apart from each other in a longitudinal direction D1 and a plurality of batteries 12 provided between the two end plates 11 and tightly arranged in the longitudinal direction D1. Each battery 12 has a positive electrode 121 and a negative electrode 122 which face upwardly. In the embodiment, every three batteries 12 are arranged as a group, the electrodes of the same polarity of each group of batteries 12 are arranged in the same side, and the electrodes of the adjacent two groups of batteries 12 are reversely arranged.

Figure 3:
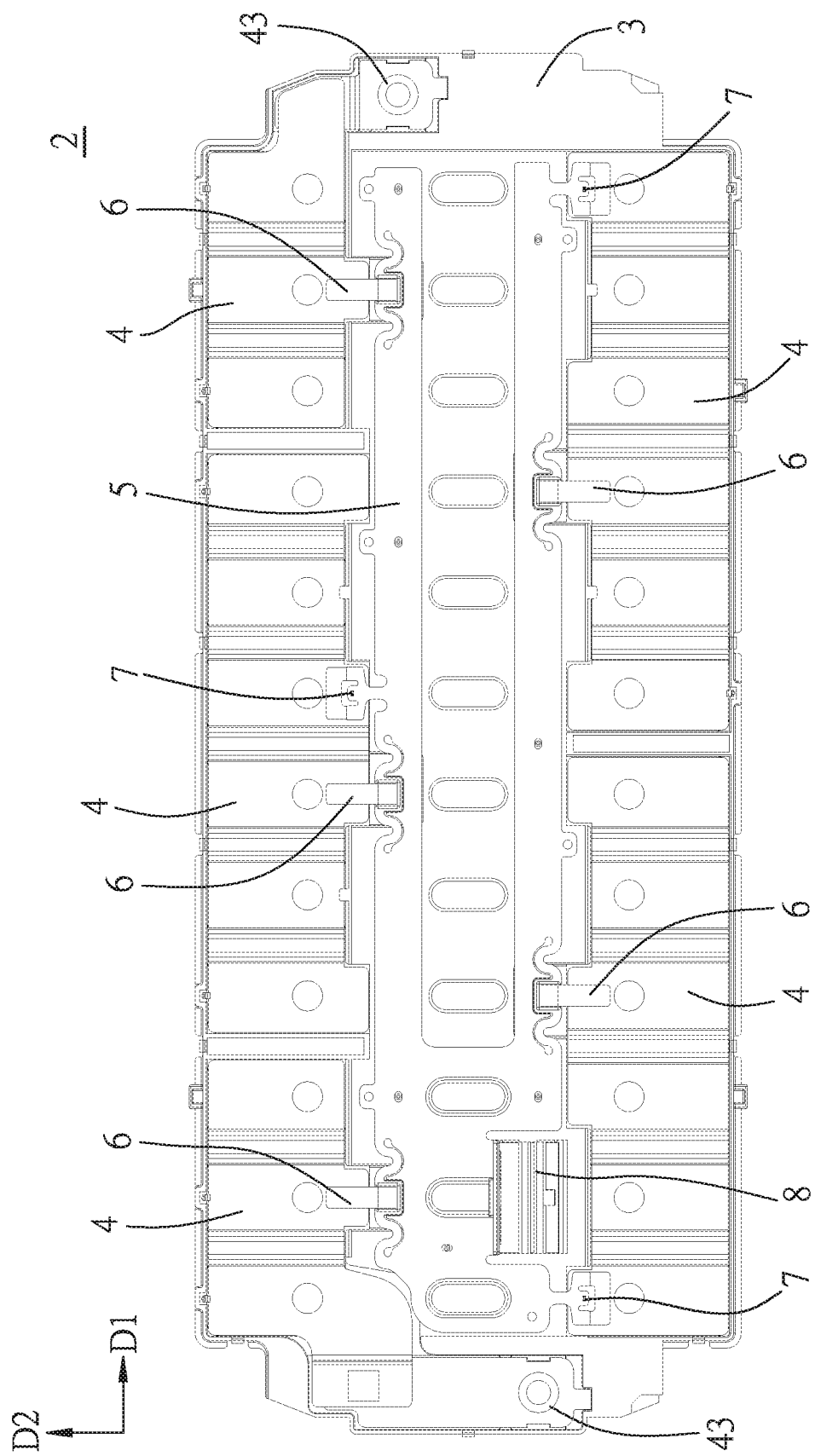
FIG. 3 is a top view of a battery connection module of the first embodiment.
Figure 4:
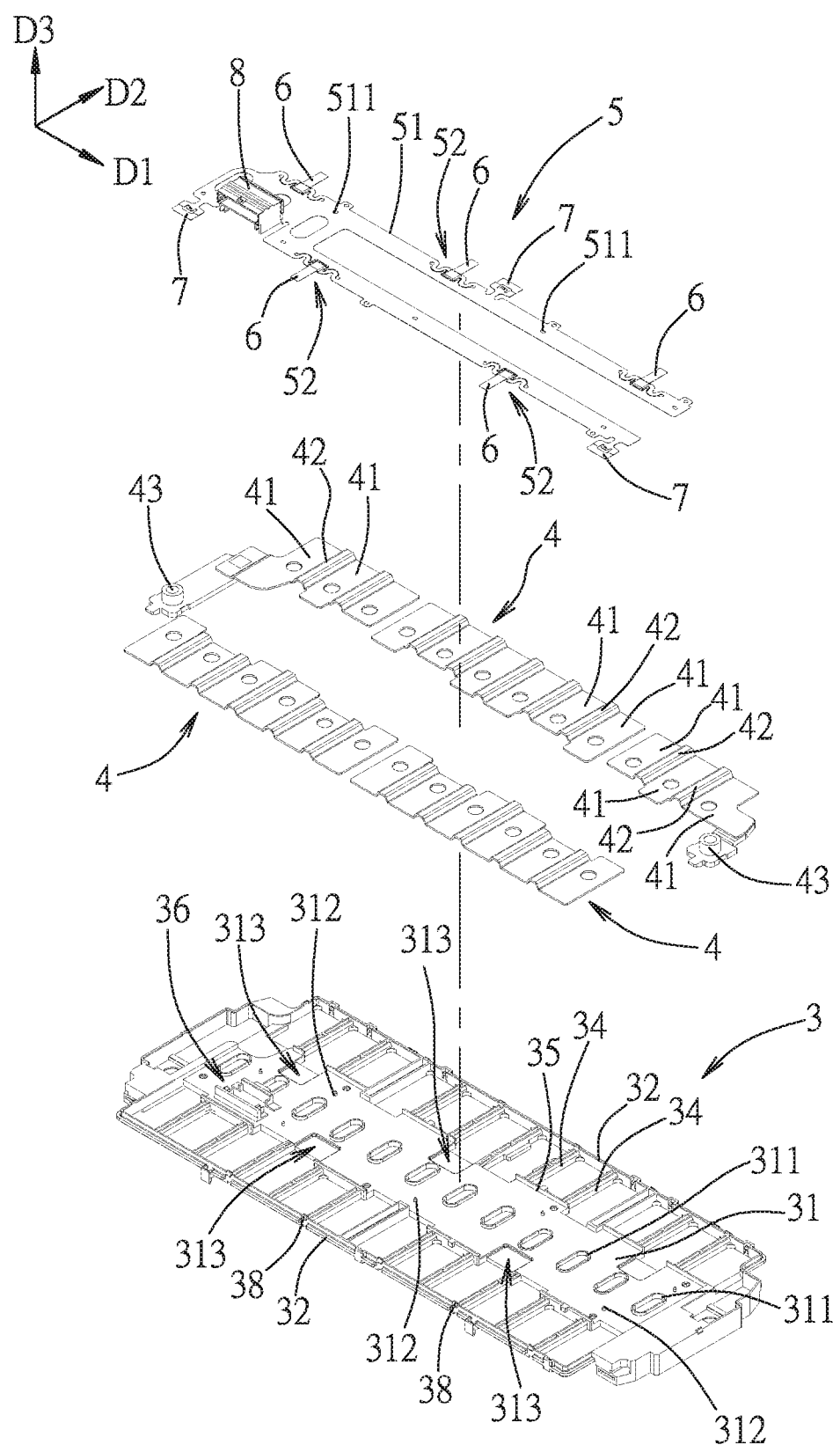
FIG. 4 is an exploded perspective view of the battery connection module.
Figure 5:
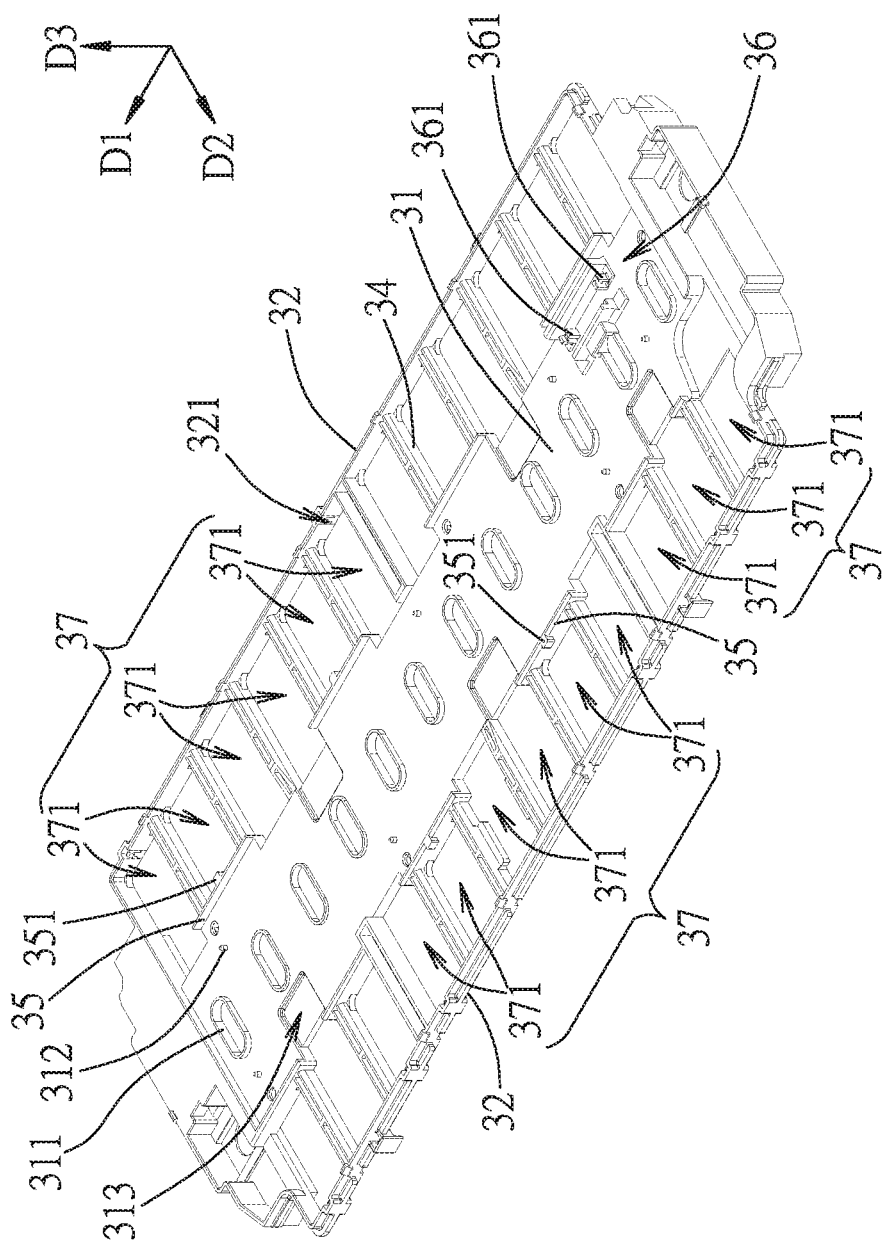
FIG. 5 is a perspective view of a carrying tray of the battery connection module.

Referring to FIGS. 3 to 5, the battery connection module 2 is used to connect the plurality of batteries 12 in the battery set 1 in series, and can detect and report status of each battery 12 such as temperature, voltage, current and the like. The battery connection module 2 includes a carrying tray 3, a plurality of busbars 4, a flexible circuit board 5, a plurality of conductive bridging pieces 6, a plurality of temperature sensors 7 and an electrical connector 8. The carrying tray 3 is made of insulating material, and the carrying tray 3 is a rectangular shape with a length direction thereof extending in the longitudinal direction D1 and a width direction thereof extending in a transverse direction D2. The carrying tray 3 covers the battery set 1, and has a base wall 31 and a plurality of mounting zones 37 positioned on opposite outer sides of the base wall 31 in the transverse direction D2 and distributed along the longitudinal direction D1. The base wall 31 is positioned in a central longitudinal length zone of the carrying tray 3, and has a plurality of exhaust holes 311 which are elliptic and arranged along the longitudinal direction D1, a plurality of positioning posts 312 provided to an upper surface of the base wall 31 in an up-down direction D3 and a plurality of recessed portions 313 formed inwardly from two opposite sides of the base wall 31 in the transverse direction D2 and recessed downwardly from the upper surface of the base wall 31. The plurality of exhaust holes 311 are adapted to allow air to flow in the battery box to assist in exhaust waste heat and gas generated during operation of the battery set 1.

Each mounting zone 37 is a rectangular frame zone surrounded by a frame wall 32 connected to the base wall 31 and the base wall 31, and each mounting zone 37 is divided into a plurality of mounting grooves 371 used to correspond to the positive electrodes 121 or the negative electrodes 122 of the batteries 12 by a plurality of supporting ribs 34 connected to the frame wall 32 and the base wall 31. The plurality of recessed portions 313 of the base wall 31 respectively correspond to the plurality of mounting zones 37, and each recessed portion 313 is communicated with one of the mounting grooves 371 in the corresponding mounting zone 37. The carrying tray 3 further has a plurality of position-limiting walls 35 extending upwardly from the two opposite sides of the base wall 31 in the transverse direction D2 and used to limit the flexible circuit board 5 in the transverse direction D2. The plurality of position-limiting walls 35 have position-limiting blocks 351 corresponding to the plurality of mounting zones 37, each frame wall 32 has a position-limiting hook 321 provided to an inner side surface thereof, the plurality of position-limiting blocks 351 and the plurality of position-limiting hooks 321 and the plurality of supporting ribs 34 cooperate so that the plurality of position-limiting blocks 351 and the plurality of position-limiting hooks 321 limit the plurality of busbars 4 from above and the plurality of supporting ribs 34 limit the plurality of busbars 4 from below in a manner that the plurality of busbars 4 can float in the up-down direction D3. The plurality of position-limiting walls 35 are used to limit the flexible circuit board 5 in the transverse direction D2, and can limit the plurality of busbars 4 with the plurality of the frame walls 32. In the embodiment, the carrying tray 3 further has a base seat 36 integrally provided to the upper surface of the base wall 31, the base seat 36 has two latching portions 361 used to latch with the electrical connector 8.

The plurality of busbars 4 are respectively provided to the plurality of mounting zones 37. Each busbar 4 has a plurality of electrode connecting portions 41 which are flat-plate shaped and are correspondingly accommodated in the plurality of mounting grooves 371 and a plurality of buffer protrusions 42 which each are connected between every two electrode connecting portions 41. The plurality of buffer protrusions 42 are respectively positioned to the plurality of supporting ribs 34 correspondingly. The electrode connecting portions 41 of the plurality of busbars 4 mechanically and electrically connect the positive electrodes 121 and the negative electrodes 122 of the plurality of batteries 12 downwardly through the mounting grooves 371, thereby connecting the plurality of batteries 12 in series. The busbars 4 positioned to both ends of the carrying tray 3 each have an outward electrode 43, thereby outputting a power of the batteries 12 connected in series outwardly.

Figure 6:
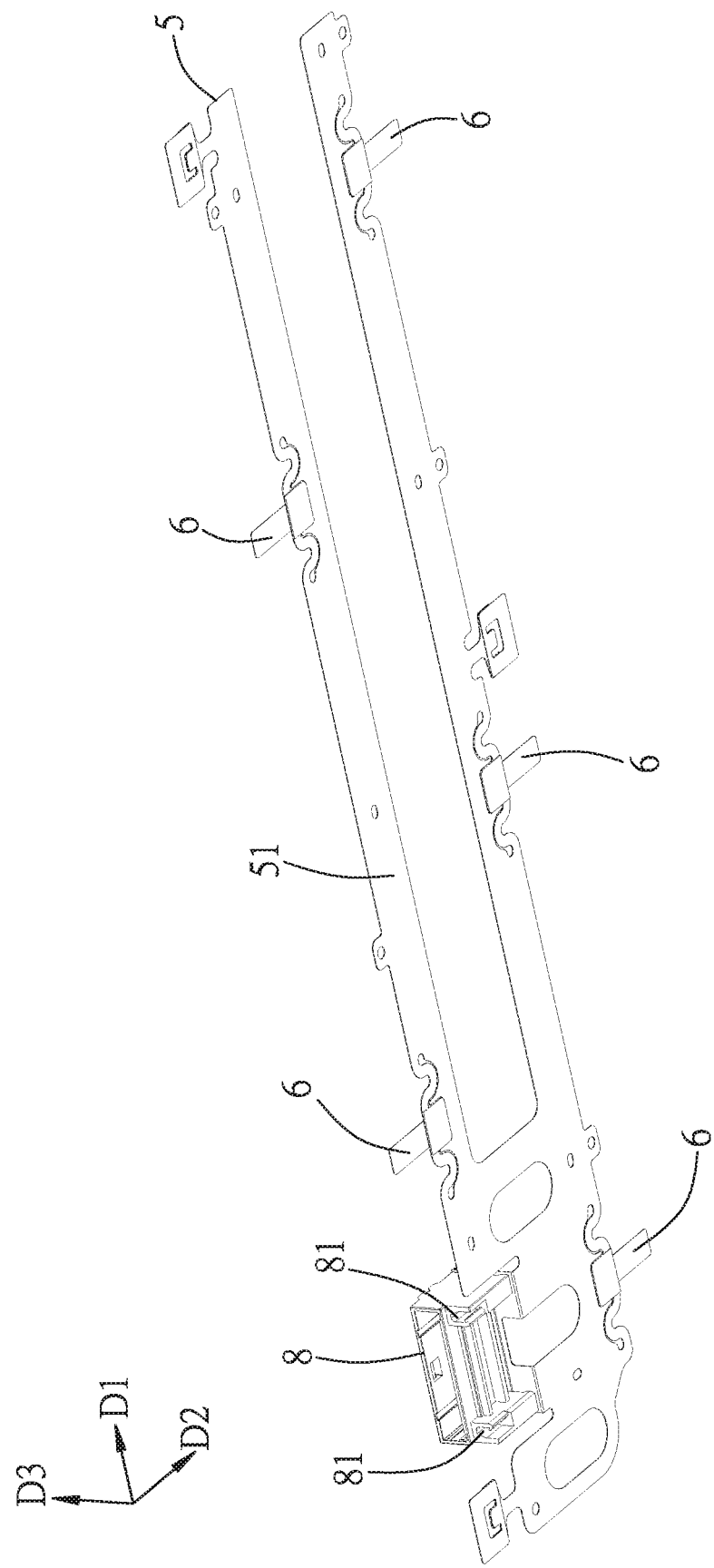
FIG. 6 is a perspective view of a flexible circuit board connecting a plurality of conductive bridging pieces, a plurality of temperature sensors and an electrical connector in the battery connection module.
Figure 7:
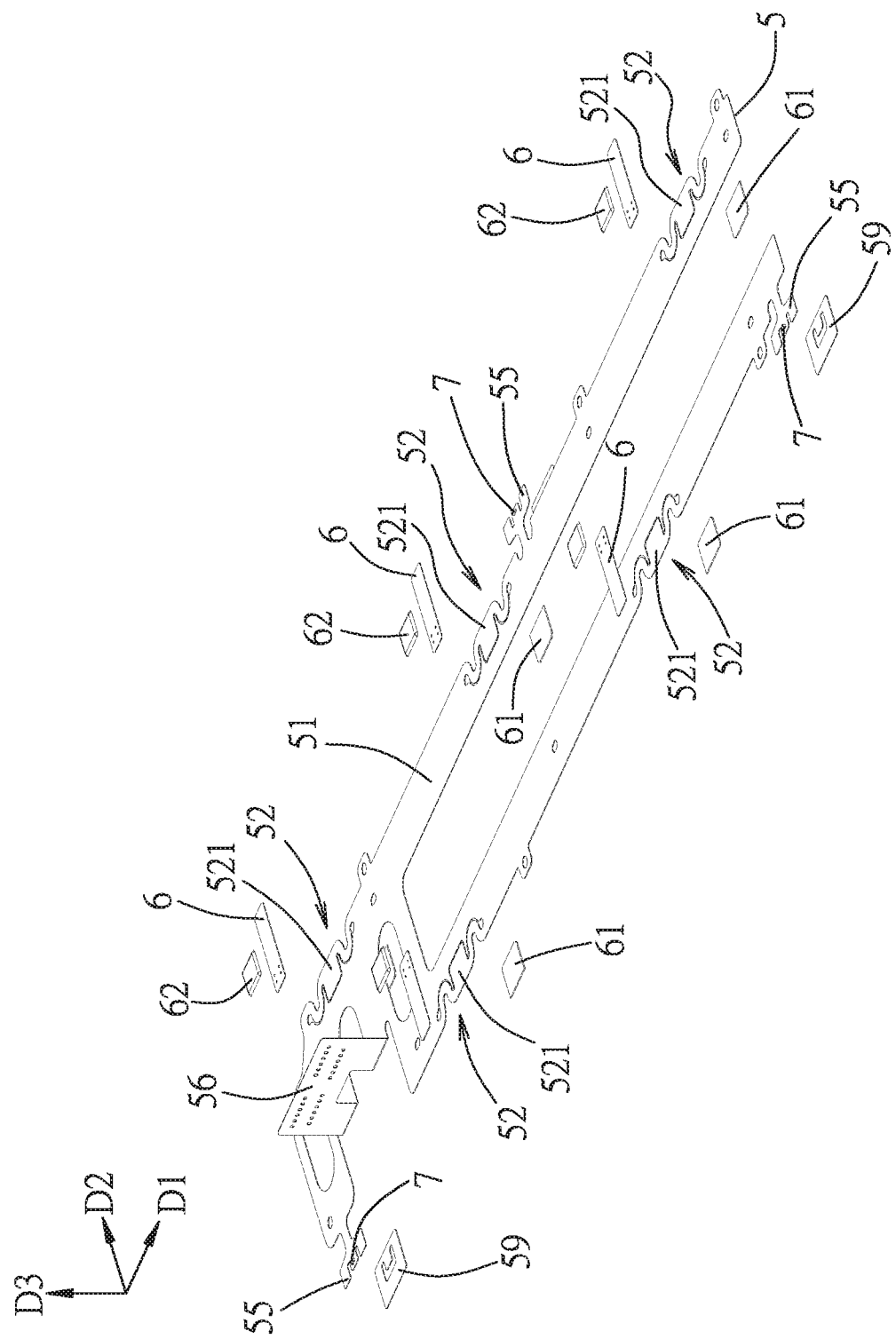
FIG. 7 is an exploded perspective view of the flexible circuit board, the plurality of conductive bridging pieces and the plurality of temperature sensors.

Referring to FIGS. 4, 6 and 7, the flexible circuit board 5 is provided to the base wall 31 of the carrying tray 3, and has a main board body 51 and a plurality of connecting board bodies 52. The main board body 51 has a plurality of positioning holes 511 through which the plurality of positioning posts 312 of the base wall 31 pass respectively, and in the embodiment, the plurality of positioning posts 312 provided through the plurality of positioning holes 511 by hot melt, so that the plurality of positioning posts 312 and the plurality of positioning holes 511 are relatively fixed. The plurality of connecting board bodies 52 are integrally connected with the main board body 51 in a floatable manner, and respectively mechanically and electrically connected with the plurality of conductive bridging pieces 6 to be electrically connected with the plurality of busbars 4 respectively.

Figure 8:
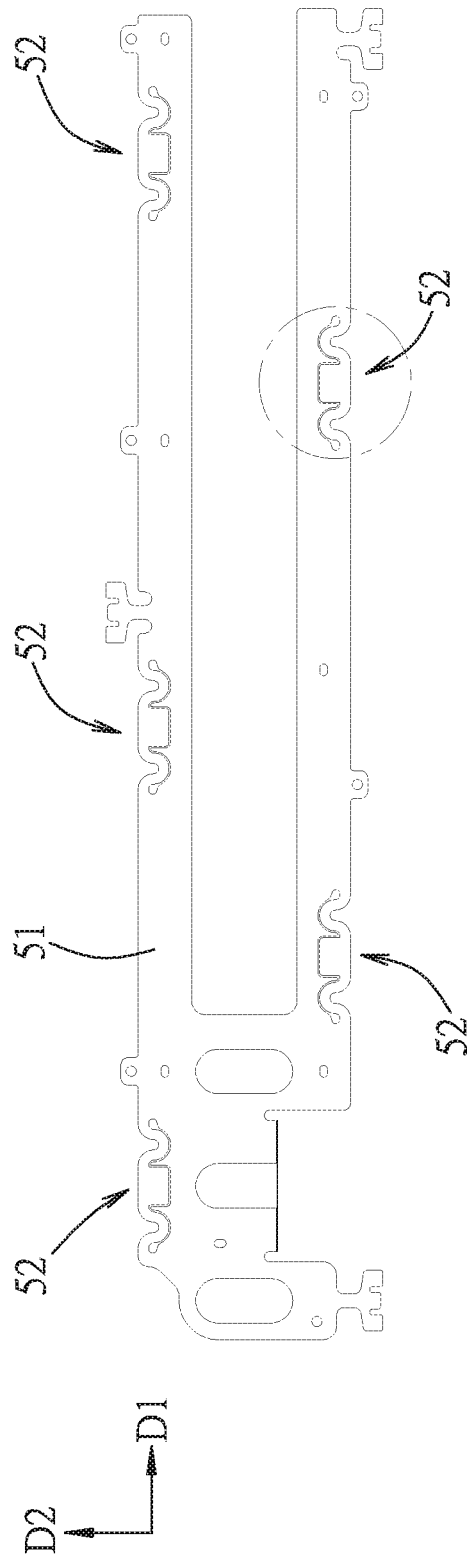
FIG. 8 is a top view of the flexible circuit board.
Figure 9:
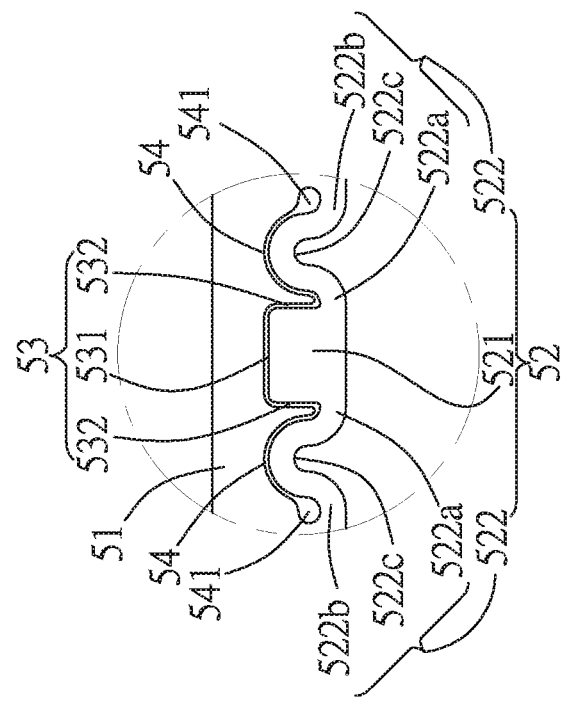
FIG. 9 is a partial enlarged view of FIG. 8 illustrating a connecting board body of the flexible circuit board.

In combination with referring to FIG. 8 and FIG. 9, the plurality of connecting board bodies 52 are provided on side edges of the main board body 51 and extend in the longitudinal direction D1, and face the plurality of busbars 4 respectively in the transverse direction D2. The plurality of connecting board bodies 52 are respectively positioned to the plurality of recessed portions 313 to enhance a space where the plurality of connecting board bodies 52 can float and deform. Each connecting board body 52 has a central portion 521 which is rectangle and two cantilevered portions 522 respectively extending from two opposite sides of the central portion 521. In the embodiment, an outer side of the central portion 521 is flush with the side edge of the main board body 51, and a top surface of the central portion 521 is used to provide the corresponding conductive bridging piece 6 thereon. The plurality of central portions 521 are respectively positioned above the plurality of recessed portions 313. Each cantilevered portion 522 has a proximal segment 522a connected to the central portion 521, a distal segment 522b connected to the main board body 51 and a curved segment 522c positioned between the proximal segment 522a and the distal segment 522b. The proximal segment 522a is connected to an end of a side of the central portion 521 close to the corresponding busbar 4 in the longitudinal direction D1, the distal segment 522b is connected to the main board body 51 in the longitudinal direction D1, thus each connecting board body 52 is connected to the main board body 51 only by the two distal segments 522b of the cantilevered portion 522 on both sides to form a double support configuration, so that a gap is formed between the connecting board body 52 and the main board body 51. Furthermore, the gap is divided into a first gap 53 which is positioned between an inner side of the central portion 521 and the main board body 51 and formed along a profile of the central portion 521 and two second gaps 54 which are respectively positioned between the two cantilevered portions 522 and the main board body 51, respectively formed along profiles of the two cantilevered portions 522 and communicated with the first gap 53. In the embodiment, because the central portion 521 is rectangle, the first gap 53 has a longitudinal portion 531 extending in the longitudinal direction D1 and two transverse portions 532 perpendicularly connected to both ends of the longitudinal portion 531 respectively and extending in the transverse direction D2. An enlarged hole 541 is formed to a tail end of each second gap 54, the two enlarged holes 541 are respectively used as a starting end and a finishing end for forming the first gap 53 and the two second gaps 54 by cutting in the process of each connecting board body 52, and can prevent the two second gaps 54 from being formed in an unexpected direction or length in the cutting process. The curved segment 522c firstly extends inwardly along the transverse direction D2, and then extends along the longitudinal direction D1 and finally extends outwardly along the transverse direction D2, so the curved segment 522c is U-shaped and opens toward the corresponding busbar 4. The two curved segments 522c of the connecting board body 52 are designed to extend along at least two directions, floating ability and deformability of the connecting board body 52 are significantly increased to overcome a position deviation between each connecting board body 52 and the corresponding busbar 4, and in turn enhance anti-vibration ability of each conductive bridging piece 6.

Referring to FIGS. 6 and 7 again, the plurality of conductive bridging pieces 6 each are connected to the top surface of the corresponding central portion 521 at one end thereof, and the plurality of conductive bridging pieces 6 are mechanically and electrically connected to the plurality of busbars 4 respectively. In the embodiment, a strengthening piece 61 may be provided to a bottom surface of the central portion 521 by bonding or welding and an adhesive 62 may be provided on the conductive bridging piece 6 to cover the conductive bridging piece 6, so a connection relationship between the conductive bridging piece 6 and the central portion 521 is strengthened, the conductive bridging piece 6 may connect the central portion 521 and the busbar 4 by, for example, welding.

The flexible circuit board 5 further has a plurality of side connecting board bodies 55 and an upright board body 56. The plurality of side connecting board bodies 55 are provided to the side edges of the main board body 51 toward the plurality of busbars 4 and allow the plurality of temperature sensors 7 to be provided thereon correspondingly. Each side connecting board body 55 is further connected with a heat conducting plate 59, and both ends of the heat conducting plate 59 are respectively connected to the side connecting board body 55 and the busbar 4, so that heat can be transmitted from the busbar 4 to the side connecting board body 55 to allow the temperature sensor 7 to detect. The upright board body 56 is perpendicularly and integrally connected to the main board body 51, allows the electrical connector 8 to be provided thereon and connected therewith. Through circuit traces arranged on the flexible circuit board 5, signals detected by the plurality of temperature sensors 7 can be transmitted to the electrical connector 8 connected to the upright board body 56. Referring to FIG. 5 and FIG. 6, the electrical connector 8 has two latching parts 81 used to be detachably connected with the two latching portions 361 of the base seat 36 of the carrying tray 3 respectively.

Referring to FIG. 2 and FIG. 4, the upper cover 9 is used to cover the battery connection module 2, and has a top cover body 91, a side cover body 92 extending downwardly from a side edge of the top cover body 91, two output ports 93 respectively formed to both ends of the top cover body 91, a plurality of latching holes 94 formed at a junction of the top cover body 91 and the side cover body 92 and an opening 95 provided to the top cover body 91. The two output ports 93 expose the two outward electrodes 43 respectively. The carrying tray 3 further has a plurality of latching blocks 38 provided to outer sides of the frame walls 32, the plurality of latching blocks 38 are used to allow the plurality of latching holes 94 to latch therewith respectively. The opening 95 exposes the electrical connector 8 correspondingly.

The flexible circuit board 5 may have different varied implementations, the following embodiments are only intended to illustrate the varied implementations of the flexible circuit board 5, other components of the battery device 100 are the same as those of the aforementioned first embodiment and will not be repeated.

Figure 10:
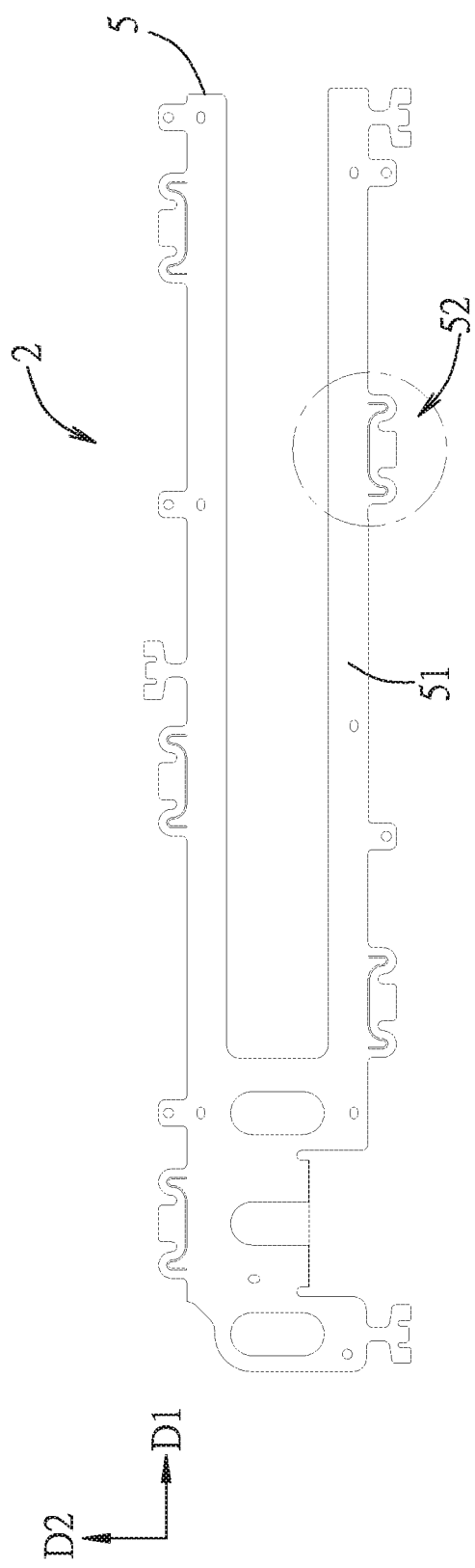
FIG. 10 is a top view of a flexible circuit board of a battery connection module of a second embodiment of the battery device of the present disclosure.
Figure 11:
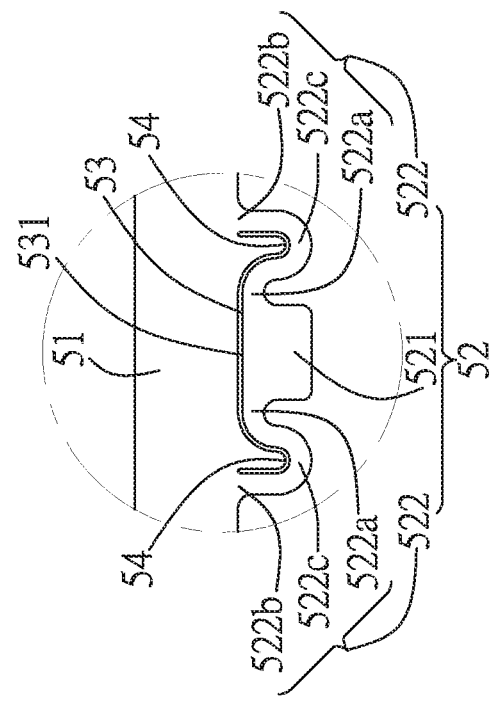
FIG. 11 is a partial enlarged view of FIG. 10 illustrating a connecting board body of the flexible circuit board.

Referring to FIG. 10 and FIG. 11, a second embodiment of the battery device 100 of the present disclosure is depicted, compared with the first embodiment, the plurality of connecting board bodies 52 of the second embodiment each wholly protrude toward the corresponding busbar 4 relative to the corresponding side edge of the main board body 51. In addition, the central portion 521 and the two cantilevered portions 522 extend in the transverse direction D2 toward the corresponding busbar 4, and the proximal segment 522a of the cantilevered portion 522 is connected to an end of the side of the central portion 521 away from the corresponding busbar 4 in the longitudinal direction D1 and the distal segment 522b of the cantilevered portion 522 is connected to the main board body 51 in the transverse direction D2, so that the first gap 53 between each central portion 521 and the main board body 51 only has the longitudinal portion 531 extending in the longitudinal direction D1 along a profile of a side of the central portion 521, does not have the transverse portions 532 (see FIG. 9) extending in the transverse direction D2. The curved segment 522c of the cantilevered portion 522 is U-shaped protruding toward the corresponding busbar 4, so that the two second gaps 54 bend outwardly first and then bend inwardly respectively along profiles of inner sides of the two cantilevered portions 522 from both ends of the first gap 53 (the aforementioned "outwardly" refers to a direction toward the corresponding busbar 4, "inwardly" refers to a direction away from the corresponding busbar 4).

Figure 12:
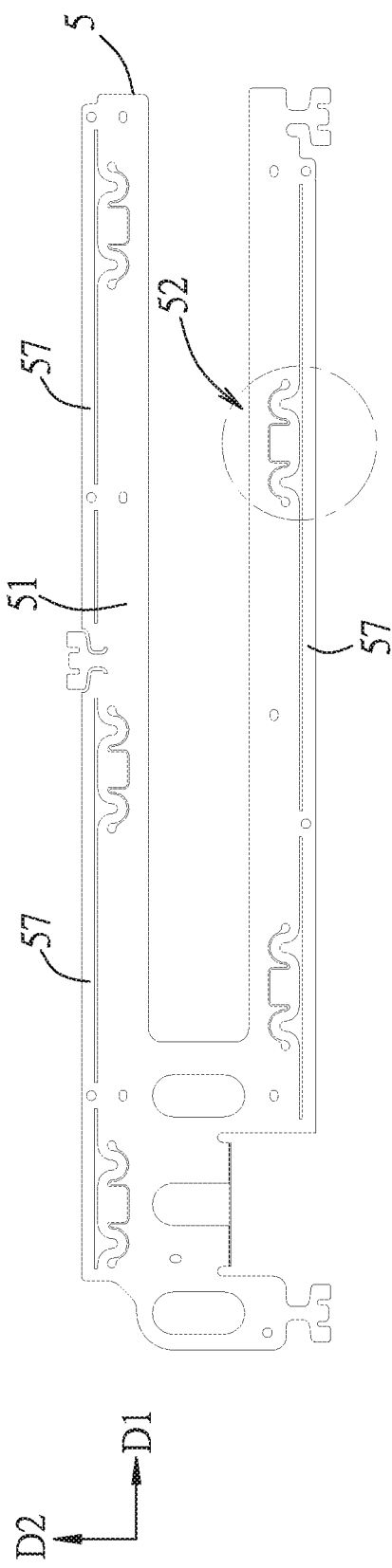
FIG. 12 is a top view of a flexible circuit board of a battery connection module of a third embodiment of the battery device of the present disclosure.
Figure 13:
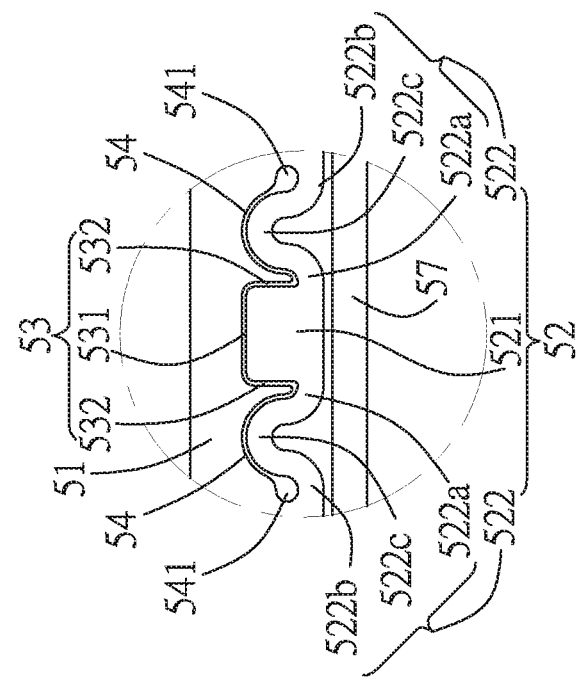
FIG. 13 is a partial enlarged view of FIG. 12 illustrating a connecting board body and a side board body of the flexible circuit board.
Figure 14:
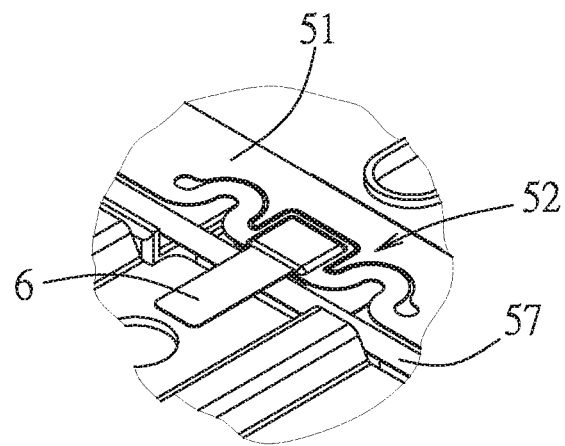
FIG. 14 is a partial schematic view illustrating the side board body is used to assist in supporting a conductive bridging piece of the third embodiment.

Referring to FIG. 12 to FIG. 14, a third embodiment of the battery device 100 of the present disclosure is depicted, compared to the first embodiment, the flexible circuit board 5 of the third embodiment further has strip shaped side board bodies 57 which each is positioned to an outer side of the corresponding connecting board body 52, each side board body 57 is integrally connected to the main board body 51, so that each connecting board body 52 is positioned between the main board body 51 and the corresponding side board body 57. The side board body 57 is used to assist in supporting the corresponding conductive bridging piece 6.

Figure 15:
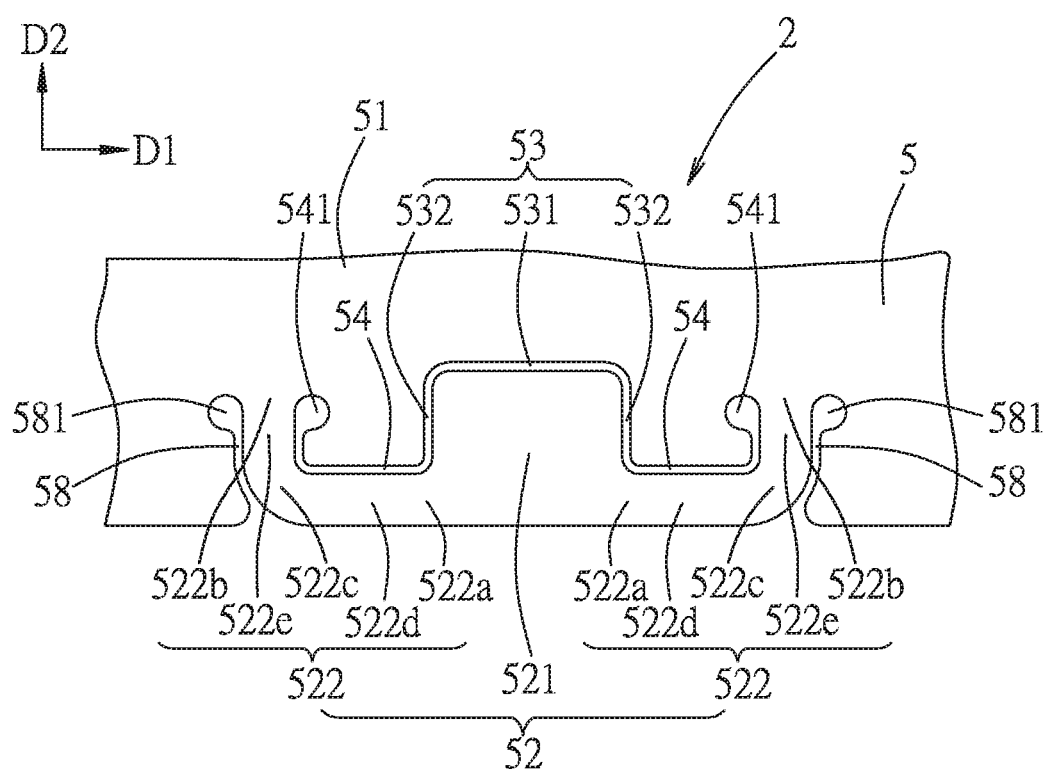
FIG. 15 is a partial schematic view illustrating a connecting board body of a flexible circuit board of a battery connection module of a fourth embodiment of the battery device of the present disclosure.

Referring to FIG. 15, a fourth embodiment of the battery device 100 of the present disclosure is depicted, the proximal segment 522a of the cantilevered portion 522 of the connecting board body 52 of the fourth embodiment is connected to an end of a side of the central portion 521 close to the corresponding busbar 4 in the longitudinal direction D1, the distal segment 522b of the cantilevered portion 522 extends toward a direction away from the corresponding busbar 4 into the main board body 51 and is connected to the main board body 51 in the transverse direction D2. The two curved segment 522c are L-shaped, each cantilevered portion 522 further has a longitudinal segment 522d connecting the proximal segment 522a and the curved segment 522c and extending in the longitudinal direction D1 and a transverse segment 522e connecting the curved segment 522c and the distal segment 522b and extending in the transverse direction D1. A third gap 58 is formed between the transverse segment 522e and the main board body 51, the third gap 58 and the second gap 54 are positioned at both sides of the transverse segment 522e, and an enlarged hole 581 is formed to a tail end of the third gap 58.

In conclusion, in the battery device 100 of the present disclosure, the cantilevered portion 522 of the connecting board body 52 of the flexible circuit board 5 is designed to extend along at least two directions, so that the connecting board body 52 has a better deformability to overcome a tolerance between the connecting board body 52 and the corresponding busbar 4, and in turn the conductive bridging piece 6 can achieve a more stable electrical connection effect and anti-vibration effect, thus the object of the present disclosure can indeed achieved.

However, the above described are only the embodiments of the present disclosure, which cannot limit the scope of the implementation of the present disclosure, that is, simple equivalent variations and modifications made according to the scope of the appended claims and the content of the specification of the present disclosure are still fallen within the scope of the present disclosure.

The invention claimed is:

1. A battery connection module, comprising:
a carrying tray;
a plurality of busbars provided to the carrying tray; and
a flexible circuit board provided to the carrying tray and comprising a main board body and a plurality of connecting board bodies integrally connected to the main board body in a floatable manner and respectively electrically connected to the plurality of busbars, each connecting board body being provided to a longitudinally extending side edge of the main board body, extending in a longitudinal direction and facing the corresponding busbar in a transverse direction, each connecting board body having a central portion having first and second opposite sides, an inner side edge extending therebetween and an opposite longitudinally extending outer side edge, and first and second cantilevered portions respectively extending longitudinally from the first and second sides of the central portion in the longitudinal direction, the outer side edge of each connecting board body being generally flush with the longitudinally extending side edge of the main board body, each cantilevered portion having a proximal segment, a distal segment and a curved segment extending between the proximal segment and the distal segment, wherein in each connecting board body 1) the proximal segment of each cantilevered portion extends from and is connected to the respective side of the central portion at the outer side edge of the central portion to be close to the corresponding busbar in the longitudinal direction and 2) the curved segment extends along at least the longitudinal direction and the transverse direction, wherein each connecting board body is connected to the main board body only by the distal segments of the first and second cantilevered portions, and wherein a gap is formed between each connecting board body and the main board body.

2. The battery connection module of claim 1, wherein in each connecting board body the gap is divided into a first gap which is positioned between the central portion and the main board body and two second gaps which are respectively positioned between the first and second cantilevered portions and the main board body and communicated with the first gap.

3. The battery connection module of claim 2, wherein each curved segment firstly extends inwardly along the transverse direction, then extends along the longitudinal direction, and finally extends outwardly along the transverse direction whereby each curved segment is U-shaped and opens toward the corresponding busbar.

4. The battery connection module of claim 3, wherein in each connecting board body the first gap has a longitudinal portion and two transverse portions perpendicularly connected to both ends of the longitudinal portion respectively, the proximal segment of each cantilevered portion is connected to the central portion in the longitudinal direction, the distal segment of each cantilevered portion is connected to the main board body in the longitudinal direction.

5. The battery connection module of claim 4, wherein in each connecting board body each second gap commences at a tail end and has an opposite end which merges into the first gap, and wherein an enlarged hole is formed at the tail end of each second gap.

6. The battery connection module of claim 2, wherein each curved segment is L-shaped, each cantilevered portion further has a longitudinal segment connecting the proximal segment and the curved segment, and a transverse segment connecting the curved segment and the distal segment.

7. The battery connection module of claim 6, wherein in each connecting board body the proximal segment of each cantilevered portion is connected to the central portion in the longitudinal direction, the distal segment of each cantilevered portion is connected to the main board body in the transverse direction, the first gap has a longitudinal portion and two transverse portions perpendicularly connected to both ends of the longitudinal portion respectively.

8. The battery connection module of claim 7, wherein in each connecting board body a separate third gap is further formed between the transverse segment and the main board body, the third gap and the second gap are positioned at both sides of the transverse segment.

9. The battery connection module of claim 8, wherein in each connecting board body each second gap commences at a tail end and has an opposite end which merges into the first gap, and the tail end of each second gap and a tail end of each third gap each are formed with an enlarged hole.

10. The battery connection module of claim 6, wherein in each connecting board body each longitudinal segment has a length and each transverse segment has a length that is less than the length of the longitudinal segment.

11. The battery connection module of claim 2, the flexible circuit board has strip shaped side board bodies which each is spaced from the outer side edge of the central portion of the corresponding connecting board body, each side board body is integrally connected to the main board body, so that each connecting board body is positioned between the main board body and the corresponding side board body.

12. The battery connection module of claim 1, wherein the carrying tray is provided with a recessed portion corresponding to the central portion of each connecting board body.

13. A battery device, comprising:
a battery set;
the battery connection module of claim 1, the plurality of busbars of the battery connection module being electrically and mechanically connected to the battery set; and
a plurality of conductive bridging pieces respectively connected between the plurality of central portions of the flexible circuit board and the plurality of busbars of the battery connection module.

14. A battery connection module, comprising: a carrying tray; a plurality of busbars provided to the carrying tray; and a flexible circuit board provided to the carrying tray and comprising a main board body and a plurality of connecting board bodies integrally connected to the main board body in a floatable manner and respectively electrically connected to the plurality of busbars, each connecting board body being provided to a longitudinally extending side edge of the main board body, extending in a longitudinal direction and facing the corresponding busbar in a transverse direction, each connecting board body having a central portion having first and second opposite sides, an outer side edge extending therebetween and an opposite inner longitudinally extending side edge, and first and second cantilevered portions respectively extending from the opposite sides of the central portion in the longitudinal direction, the inner longitudinally extending side edge of each connecting board body is generally flush with the longitudinally extending side edge of the main board body, each cantilevered portion having a proximal segment, a distal segment and a curved segment extending between the proximal segment and the distal segment, wherein in each connecting board body 1) the proximal segment of each cantilevered portion extends from and is connected to the respective side of the central portion at the inner side edge of the central portion to be distal to the corresponding busbar in the longitudinal direction, 2) the curved segment extends along at least the longitudinal direction and the transverse direction, and 3) the distal segment protrudes outward from the longitudinally extending side edge of the main board body, wherein each connecting board body is connected to the main board body only by the distal segments of the first and second cantilevered portions, wherein a gap is formed between each connecting board body and the main board body.

15. The battery connection module of claim 14, wherein in each connecting board body the gap is divided into a first gap which is positioned between the central portion and the main board body and two second gaps which are respectively positioned between the first and second cantilevered portions and the main board body and communicated with the first gap.

16. The battery connection module of claim 15, wherein each curved segment is U-shaped and protrudes toward the corresponding busbar, whereby the two second gaps bend outwardly first and then bend inwardly respectively along profiles of inner sides of the first and second cantilevered portions from both ends of the first gap.

17. The battery connection module of claim 16, wherein in each connecting board body the first gap has a longitudinal portion extending in the longitudinal direction along a profile of a side of the central portion, the two second gaps bend and extend respectively from both ends of the longitudinal portion along profiles of sides of the first and second cantilevered portions.

18. The battery connection module of claim 15, wherein the distal segment of each cantilevered portion is connected to the main board body in the transverse direction, whereby the first gap only has a longitudinal portion extending in the longitudinal direction along a profile of a side of the central portion.

19. A battery device, comprising:
   a battery set;
   the battery connection module of claim 16, the plurality of busbars of the battery connection module being electrically and mechanically connected to the battery set; and
   a plurality of conductive bridging pieces respectively connected between the plurality of central portions of the flexible circuit board and the plurality of busbars of the battery connection module.

* * * * *